(12) United States Patent
Rizzolo et al.

(10) Patent No.: US 11,195,993 B2
(45) Date of Patent: Dec. 7, 2021

(54) ENCAPSULATION TOPOGRAPHY-ASSISTED SELF-ALIGNED MRAM TOP CONTACT

(71) Applicant: International Business Machines Corporation, Armonk, NY (US)

(72) Inventors: Michael Rizzolo, Delmar, NY (US); Nicholas Anthony Lanzillo, Troy, NY (US); Benjamin D. Briggs, Clifton Park, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 16/572,281

(22) Filed: Sep. 16, 2019

(65) Prior Publication Data

US 2021/0083179 A1    Mar. 18, 2021

(51) Int. Cl.
*H01L 43/12* (2006.01)
*H01L 43/02* (2006.01)
(Continued)

(52) U.S. Cl.
CPC .......... *H01L 43/12* (2013.01); *G11C 11/161* (2013.01); *H01F 10/3259* (2013.01);
(Continued)

(58) Field of Classification Search
CPC .................. H01L 43/02; H01L 43/12; H01L 21/31051–31053; H01L 21/31116; H01L 21/32051; H01L 21/3212
See application file for complete search history.

(56) References Cited

U.S. PATENT DOCUMENTS

| 6,341,053 B1 | 1/2002 | Nakada et al. |
| 6,780,652 B2 | 8/2004 | Lee |

(Continued)

FOREIGN PATENT DOCUMENTS

| CN | 106887443 A | 6/2017 |
| CN | 107565016 A | 1/2018 |
| CN | 108376690 A | 8/2018 |

OTHER PUBLICATIONS

Stewart et al., "Mechanistic Understanding of Line End Shortening," Proceedings SPIE 4345, Advances in Resist Technology and Processing XVIII (Aug. 2001) (9 pages).

(Continued)

*Primary Examiner* — Victoria K. Hall
(74) *Attorney, Agent, or Firm* — L. Jeffrey Kelly; Michael J. Chang, LLC

(57) ABSTRACT

Encapsulation topography-assisted techniques for forming self-aligned top contacts in MRAM devices are provided. In one aspect, a method for forming an MRAM device includes: forming MTJs on interconnects embedded in a first dielectric; depositing an encapsulation layer over the MTJs; burying the MTJs in a second dielectric; patterning a trench in the second dielectric over the MTJs exposing the encapsulation layer over tops of the MTJs which creates a topography at the trench bottom; forming a metal line in the trench over the topography; recessing the metal line which breaks up the metal line into segments separated by exposed peaks of the encapsulation layer; recessing the exposed peaks of the encapsulation layer to form recesses at the tops of the MTJs; and forming self-aligned contacts in the recesses. An MRAM device is also provided.

25 Claims, 7 Drawing Sheets

(51) Int. Cl.
  *H01L 27/22* (2006.01)
  *H01F 10/32* (2006.01)
  *H01F 41/32* (2006.01)
  *G11C 11/16* (2006.01)

(52) U.S. Cl.
  CPC ........... *H01F 41/32* (2013.01); *H01L 27/222* (2013.01); *H01L 43/02* (2013.01)

(56) References Cited

U.S. PATENT DOCUMENTS

| | | | | |
|---|---|---|---|---|
| 6,783,995 B2* | 8/2004 | Hineman | ................ | H01F 41/34 438/3 |
| 6,845,038 B1 | 1/2005 | Shukh | | |
| 7,211,849 B2* | 5/2007 | Hineman | ............. | H01F 41/302 257/295 |
| 7,772,663 B2* | 8/2010 | Kanakasabapathy | ... | H01L 43/08 257/422 |
| 7,803,639 B2 | 9/2010 | Assefa et al. | | |
| 7,919,794 B2* | 4/2011 | Gu | ....................... | H01L 27/228 257/241 |
| 8,129,268 B2 | 3/2012 | Breitwisch | | |
| 8,138,562 B2* | 3/2012 | Mao | .................... | H01L 27/222 257/421 |
| 8,574,928 B2* | 11/2013 | Satoh | .................... | H01L 43/12 438/3 |
| 8,709,956 B2* | 4/2014 | Satoh | .................. | H01L 23/5226 438/778 |
| 8,772,888 B2* | 7/2014 | Jung | ...................... | H01L 43/12 257/421 |
| 9,013,045 B2* | 4/2015 | Satoh | .................... | H01L 45/04 257/774 |
| 9,082,695 B2* | 7/2015 | Satoh | .................... | H01L 27/224 |
| 9,318,696 B2 | 4/2016 | Lu et al. | | |
| 9,343,659 B1* | 5/2016 | Lu | .......................... | H01L 43/12 |
| 9,450,180 B1* | 9/2016 | Annunziata | ............. | H01L 43/08 |
| 9,472,749 B2* | 10/2016 | Annunziata | ............. | H01L 43/12 |
| 9,490,164 B1* | 11/2016 | Engelmann | ....... | H01L 21/76829 |
| 9,502,640 B1* | 11/2016 | Annunziata | ............. | H01L 43/08 |
| 9,525,125 B1 | 12/2016 | Annunziata et al. | | |
| 9,553,128 B1 | 1/2017 | Annunziata et al. | | |
| 9,564,575 B2* | 2/2017 | Shum | ...................... | H01L 43/08 |
| 9,601,686 B1* | 3/2017 | Annunziata | ............. | H01L 43/08 |
| 9,614,146 B2* | 4/2017 | Annunziata | ............. | H01L 43/08 |
| 9,647,033 B2* | 5/2017 | Shin | ...................... | H01L 27/228 |
| 9,653,679 B1* | 5/2017 | Annunziata | ............. | H01L 43/12 |
| 9,660,179 B1* | 5/2017 | Annunziata | ........... | H01L 27/224 |
| 9,698,198 B2* | 7/2017 | Choi | ...................... | H01L 43/12 |
| 9,728,714 B2* | 8/2017 | Annunziata | ............. | H01L 43/02 |
| 9,818,935 B2* | 11/2017 | Chuang | .................. | H01L 43/12 |
| 9,847,476 B2* | 12/2017 | Annunziata | ............. | H01L 43/08 |
| 9,917,137 B1* | 3/2018 | Briggs | .................... | H01L 43/02 |
| 9,997,699 B2* | 6/2018 | Kim | ........................ | H01L 43/12 |
| 10,003,014 B2 | 6/2018 | Gaidis et al. | | |
| 10,032,828 B2 | 7/2018 | Chuang et al. | | |
| 10,056,543 B2* | 8/2018 | Bak | ........................ | H01L 43/08 |
| 10,084,127 B2* | 9/2018 | Annunziata | ............. | H01L 43/12 |
| 10,109,675 B2* | 10/2018 | Annunziata | ........... | H01L 27/228 |
| 10,164,181 B2* | 12/2018 | Yang | .................... | H01L 45/146 |
| 10,276,633 B1* | 4/2019 | Hung | .................. | H01L 23/5226 |
| 10,461,247 B2* | 10/2019 | Shum | ...................... | H01L 43/08 |
| 10,522,740 B2* | 12/2019 | Chuang | .................. | H01L 43/02 |
| 10,608,045 B2* | 3/2020 | Hung | ........... | H01F 10/3254 |
| 10,636,961 B2 | 4/2020 | Chuang et al. | | |
| 10,797,230 B2* | 10/2020 | Chuang | .................. | H01L 43/12 |
| 10,833,250 B2* | 11/2020 | Bak | ........................ | H01L 43/10 |
| 10,847,576 B2* | 11/2020 | Tsubata | .................. | H01L 43/12 |
| 10,950,657 B2* | 3/2021 | Nagel | .................... | H01L 43/02 |
| 10,991,757 B2* | 4/2021 | Huang | .................... | H01L 43/08 |
| 11,031,250 B2* | 6/2021 | Ebrish | ............. | H01L 21/31053 |
| 2003/0203510 A1* | 10/2003 | Hineman | ................ | G11C 11/15 438/3 |
| 2006/0108622 A1* | 5/2006 | Joo | ................... | H01L 27/11507 257/295 |
| 2006/0148234 A1* | 7/2006 | Chen | ...................... | H01L 43/12 438/618 |
| 2006/0163642 A1* | 7/2006 | Widdershoven | ... | G11C 16/0458 257/315 |
| 2008/0096290 A1* | 4/2008 | Smith | ...................... | H01L 43/12 438/3 |
| 2008/0198647 A1* | 8/2008 | Kanakasabapathy | ... | H01L 43/12 365/171 |
| 2008/0277703 A1* | 11/2008 | Iwayama | ............. | G11C 11/5607 257/295 |
| 2009/0209050 A1* | 8/2009 | Wang | ...................... | H01L 43/12 438/3 |
| 2011/0089507 A1* | 4/2011 | Mao | ........................ | H01L 27/222 257/421 |
| 2012/0032287 A1* | 2/2012 | Li | ............................ | H01L 43/12 257/421 |
| 2012/0068282 A1* | 3/2012 | Matsuoka | ............. | G11C 11/161 257/421 |
| 2012/0205764 A1* | 8/2012 | Chen | ...................... | H01L 43/08 257/422 |
| 2012/0306033 A1* | 12/2012 | Satoh | ..................... | H01L 27/228 257/421 |
| 2013/0032775 A1* | 2/2013 | Satoh | ...................... | H01L 45/06 257/1 |
| 2013/0032907 A1* | 2/2013 | Satoh | .................. | H01L 45/1233 257/421 |
| 2013/0062714 A1* | 3/2013 | Zhu | ...................... | H01F 10/3254 257/421 |
| 2013/0075840 A1* | 3/2013 | Satoh | ...................... | H01L 43/12 257/421 |
| 2013/0267042 A1* | 10/2013 | Satoh | .................... | H01L 27/222 438/3 |
| 2014/0210103 A1* | 7/2014 | Satoh | ...................... | H01L 27/222 257/774 |
| 2015/0021724 A1 | 1/2015 | Mani | | |
| 2015/0069547 A1* | 3/2015 | Iwayama | ................ | H01L 43/02 257/421 |
| 2015/0171314 A1* | 6/2015 | Li | ........................... | H01L 43/12 257/421 |
| 2015/0287910 A1* | 10/2015 | Lu | ........................... | H01L 43/02 257/421 |
| 2015/0311253 A1* | 10/2015 | Choi | ...................... | H01L 43/08 257/252 |
| 2016/0072047 A1* | 3/2016 | Seto | ...................... | H01L 43/08 257/421 |
| 2016/0133828 A1* | 5/2016 | Lu | ........................... | H01L 43/12 257/421 |
| 2016/0141490 A1* | 5/2016 | Jung | .................... | H01L 23/481 257/421 |
| 2016/0141496 A1* | 5/2016 | Park | ...................... | H01L 27/228 438/3 |
| 2016/0181509 A1* | 6/2016 | Shin | ...................... | H01L 43/12 438/3 |
| 2016/0181520 A1* | 6/2016 | Park | ...................... | H01L 43/02 711/118 |
| 2016/0204340 A1* | 7/2016 | Kumura | .................. | H01L 43/08 257/421 |
| 2016/0268336 A1* | 9/2016 | Shum | ...................... | H01L 43/12 |
| 2016/0336506 A1* | 11/2016 | Annunziata | ............. | H01L 43/08 |
| 2016/0336507 A1* | 11/2016 | Annunziata | ............. | H01L 43/08 |
| 2016/0351792 A1* | 12/2016 | Jiang | .................... | H01L 43/08 |
| 2017/0054070 A1* | 2/2017 | Bak | ........................ | H01L 43/10 |
| 2017/0084819 A1* | 3/2017 | Lu | ........................... | H01L 43/10 |
| 2017/0092850 A1* | 3/2017 | Lee | ........................ | H01L 43/10 |
| 2017/0098759 A1* | 4/2017 | Oh | ........................... | H01L 43/12 |
| 2017/0110507 A1* | 4/2017 | Suh | ........................ | H01L 43/02 |
| 2017/0110657 A1* | 4/2017 | Park | .................... | H01L 27/224 |
| 2017/0155041 A1* | 6/2017 | Annunziata | ............. | H01L 43/12 |
| 2018/0069174 A1* | 3/2018 | Annunziata | ............. | H01L 43/08 |
| 2018/0097175 A1* | 4/2018 | Chuang | .................. | H01L 43/08 |
| 2018/0182809 A1* | 6/2018 | Liu | ........................ | H01L 43/12 |
| 2018/0309053 A1* | 10/2018 | Annunziata | ............. | H01L 43/08 |
| 2018/0351080 A1* | 12/2018 | Bak | ........................ | H01L 43/12 |
| 2018/0374895 A1 | 12/2018 | Hsu et al. | | |
| 2019/0088864 A1* | 3/2019 | Cho | .................... | H01L 27/228 |
| 2019/0140018 A1* | 5/2019 | Kalnitsky | ............. | H01F 41/34 |
| 2019/0140019 A1* | 5/2019 | Nagel | .................... | H01L 43/08 |

(56) References Cited

U.S. PATENT DOCUMENTS

| | | | | |
|---|---|---|---|---|
| 2019/0157344 A1* | 5/2019 | Wei | .................... | H01L 27/222 |
| 2019/0273117 A1* | 9/2019 | Hung | .................... | H01L 23/528 |
| 2019/0280187 A1* | 9/2019 | Sonoda | .................... | H01L 43/12 |
| 2019/0341544 A1* | 11/2019 | Hung | .................... | H01L 43/08 |
| 2019/0386210 A1* | 12/2019 | Rizzolo | .................... | H01L 43/02 |
| 2019/0393265 A1* | 12/2019 | Ying | .................... | H01L 43/10 |
| 2020/0006424 A1* | 1/2020 | Sato | .................... | G11C 11/1673 |
| 2020/0006638 A1* | 1/2020 | Chen | .................... | H01L 43/02 |
| 2020/0006641 A1* | 1/2020 | Lieu | .................... | H01L 43/10 |
| 2020/0098975 A1* | 3/2020 | Yang | .................... | H01L 43/08 |
| 2020/0098982 A1* | 3/2020 | Chuang | .................... | H01L 43/12 |
| 2020/0111511 A1* | 4/2020 | Yang | .................... | H01L 45/06 |
| 2020/0126791 A1* | 4/2020 | Rizzolo | .................... | H01L 21/0332 |
| 2020/0127194 A1* | 4/2020 | Rizzolo | .................... | H01L 43/12 |
| 2020/0161250 A1* | 5/2020 | Seo | .................... | H01L 43/02 |
| 2020/0243756 A1* | 7/2020 | Marchack | .................... | H01L 43/08 |
| 2020/0266335 A1* | 8/2020 | Wang | .................... | H01L 43/02 |
| 2020/0365795 A1* | 11/2020 | Chuang | .................... | H01L 27/228 |
| 2020/0373478 A1* | 11/2020 | Wang | .................... | H01L 29/82 |
| 2021/0020508 A1* | 1/2021 | Briggs | .................... | H01L 43/12 |
| 2021/0066126 A1* | 3/2021 | Ramanathan | .................... | H01L 21/76897 |
| 2021/0082482 A1* | 3/2021 | Luo | .................... | H01L 27/226 |
| 2021/0159394 A1* | 5/2021 | Rizzolo | .................... | H01L 43/02 |
| 2021/0265422 A1* | 8/2021 | Wu | .................... | H01L 29/78642 |

OTHER PUBLICATIONS

International Search Report and Written Opinion for PCT/IB2020/058321 dated Dec. 16, 2020 (11 pages).

* cited by examiner

ENCAPSULATION TOPOGRAPHY-ASSISTED SELF-ALIGNED MRAM TOP CONTACT

FIELD OF THE INVENTION

The present invention relates to magnetic random access memory (MRAM) devices, and more particularly, to encapsulation topography-assisted techniques for forming self-aligned top contacts in MRAM devices.

BACKGROUND OF THE INVENTION

Magnetic random access memory (MRAM) is a type of non-volatile memory that stores data in magnetic storage elements called magnetic tunnel junctions (MTJs). Each MTJ includes at least one 'free' magnetic layer separated from at least one 'fixed' magnetic layer by a tunnel barrier. The resistance of the MTJ changes depending on the orientation of the magnetization of the free versus fixed layers. The magnetization of the free layer can be switched (relative to the fixed layer) in order to write data to the device.

During MRAM device fabrication, top contacts are formed to access the MTJs. Formation of the top contacts in advanced technology nodes, however, can present some notable fabrication challenges. For instance, metal line pull back (also referred to as line end shortening) can undesirably result in misalignment at the end of the line. For a general discussion of line pull back/end shortening see, for example, Stewart et al., "Mechanistic Understanding of Line End Shortening," Proceedings SPIE 4345, Advances in Resist Technology and Processing XVIII (August 2001) (9 pages). In some instances, line pull back can result in an MTJ not making contact with a metal line above. As such, conventional processes avoid placing contacts too close to the end of a metal line in order to avoid any misalignment due to pull back. Doing so, however, imposes strict limitations on the design.

Therefore, techniques for contact formation that eliminates the dependency on line pull back would be desirable.

SUMMARY OF THE INVENTION

The present invention provides encapsulation topography-assisted techniques for forming self-aligned top contacts in magnetic random access memory (MRAM) devices. In one aspect of the invention, a method for forming an MRAM device is provided. The method includes: forming magnetic tunnel junctions (MTJs) on interconnects embedded in a first dielectric; depositing an encapsulation layer over the MTJs; burying the MTJs in a second dielectric; patterning a trench in the second dielectric over the MTJs exposing the encapsulation layer over tops of the MTJs which creates a topography at a bottom of the trench; forming a metal line in the trench over the topography at a bottom of the trench; recessing the metal line down to and exposing the encapsulation layer, wherein the recessing breaks up the metal line into segments separated by exposed peaks of the encapsulation layer over the MTJs; recessing the exposed peaks of the encapsulation layer to form recesses at the tops of the MTJs in between the segments of the metal line; and forming contacts in the recesses self-aligned to the tops of the MTJs.

In another aspect of the invention, an MRAM device is provided. The MRAM device includes: MTJs disposed on interconnects embedded in a first dielectric; an encapsulation layer disposed over the MTJs; a second dielectric surrounding the MTJs; recesses in the encapsulation layer at the tops of the MTJs in between segments of a metal line, wherein the segments of the metal line are separated from the second dielectric by a barrier layer; and contacts formed in the recesses that are self-aligned to the tops of the MTJs, wherein the contacts are in direct contact with the MTJs, and wherein the contacts are connected to the segments of the metal line through the barrier layer.

A more complete understanding of the present invention, as well as further features and advantages of the present invention, will be obtained by reference to the following detailed description and drawings.

DETAILED DESCRIPTION OF PREFERRED EMBODIMENTS

As highlighted above, in advanced technology nodes, line end pull back and overlay can result in a magnetic tunnel junction (MTJ) of a magnetic random access memory (MRAM) device not making contact with a metal line above. Advantageously, provided herein are techniques for forming self-aligned line end contacts which eliminate the dependency on pull back and overlay of the line above, thereby achieving metallization contact between the top of the MTJ and the overlying metal level.

As will be described in detail below, the MTJs are encapsulated in an insulator. The topography of those encapsulated MTJs is then leveraged to self-align the contacts with the tops of the MTJs, without needing direct interaction between the MTJs and the metal line.

Figure 1:
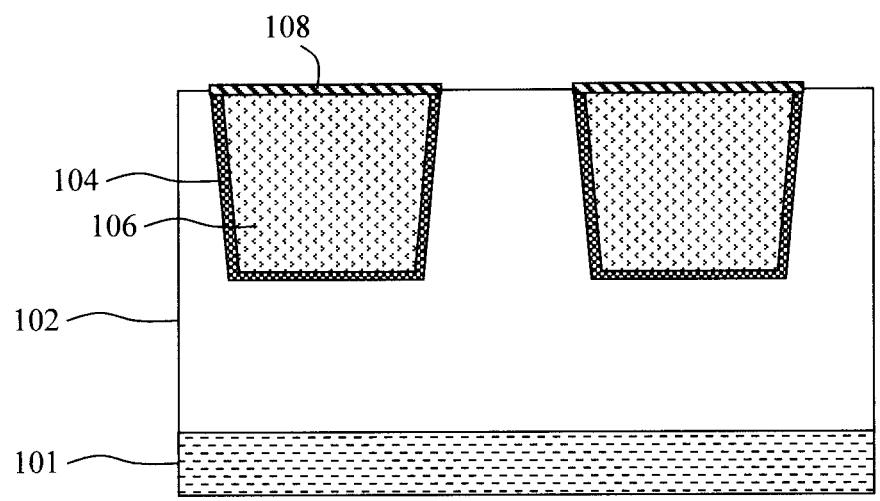
FIG. 1 is a cross-sectional diagram illustrating interconnects with a capping layer having been formed in a dielectric over an underlying substrate according to an embodiment of the present invention.

An exemplary methodology for forming an MRAM device is now described by way of reference to FIGS. 1-7. As shown in FIG. 1, interconnects 106 are formed in a dielectric 102. According to an exemplary embodiment, interconnects 106 include metal lines, conductive vias, or combinations thereof. Notably, interconnects 106 represent a metal level MX in the design, and other device elements (not shown) may already be present beneath dielectric 102 such as transistors, resistors, capacitors, etc. formed on an underlying substrate 101.

According to an exemplary embodiment, substrate 101 is a bulk semiconductor wafer, such as a bulk silicon (Si), bulk germanium (Ge), bulk silicon germanium (SiGe) and/or bulk III-V semiconductor wafer. Alternatively, substrate 101 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Suitable dielectrics 102 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH).

Standard metallization techniques are used to form interconnects 106 embedded in dielectric 102. For instance, features such as vias and/or trenches (for metal lines) are first patterned in dielectric 102. The features are then filled with a metal or metals to form interconnects 106. Suitable metals include, but are not limited to, copper (Cu) and/or cobalt (Co). Prior to placing metal in the features, a conformal barrier layer 104 is deposited into and lining the features. See FIG. 1. By way of example only, suitable barrier materials include, but are not limited to, titanium (Ti), titanium nitride (TiN), tantalum (Ta) and/or tantalum nitride (TaN). Barrier layer 104 separates interconnects 106 from dielectric 102. When the metal is Cu, embodiments are also contemplated herein where a thin (e.g., from about 1 nanometer (nm) to about 3 nm) Cu seed layer (not shown) is deposited onto barrier layer 104 using, e.g., evaporation, sputtering etc. Cu is then plated onto the seed layer to form interconnects 106.

A planarizing process such as chemical mechanical polishing (CMP) is used to remove the overburden, if any, from the metal fill. As a result, interconnects 106 are coplanar with the top surface of dielectric 102. See FIG. 1. A capping layer 108 is then formed on the interconnects 106. Suitable materials for capping layer 108 include, but are not limited to, ruthenium (Ru), Ta, TaN, Ti, TiN and/or tungsten (W).

MTJs 202 are then formed on the interconnects 106 (over the capping layer 108). See FIG. 2. Each MTJ 202 generally includes a stack of magnetic metal layers separated by a tunnel barrier. The particular configuration of the stack can vary depending on the application at hand. According to an exemplary embodiment, the layers of MTJs 202 are deposited sequentially as a stack on dielectric 102 and interconnects 106 using a process such as atomic layer deposition (ALD), chemical vapor deposition (CVD) or physical vapor deposition (PVD). The stack of layers is then patterned into the individual (e.g., pillar-shaped) MTJs 202 shown in FIG. 2 that are disposed on interconnects 106.

The particular composition and configuration of the MTJ stack can vary depending on the application at hand. For instance, by way of example only, suitable materials for the magnetic metal layers include, but are not limited to, cobalt (Co), iron (Fe), nickel (Ni), Co alloys, Fe alloys and/or Ni alloys. Suitable materials for the tunnel barrier include, but are not limited to, aluminum (Al) and/or magnesium (Mg) oxides. According to an exemplary embodiment, the tunnel barrier has a thickness of from about 1 nanometer (nm) to about 3 nm and ranges therebetween. An exemplary MTJ element is described in conjunction with the description of FIG. 13, below.

In one exemplary embodiment, the orientation of the magnetization of the magnetic metal layers on one side of the tunnel barrier is fixed, while the orientation of the magnetization of the magnetic metal layers on the other side of the tunnel barrier is free, and can be switched by an applied current tunneled through the tunnel barrier. Data is stored in MTJs 202 based on the orientation of the magnetization of the free magnetic metal layer(s) relative to the magnetization of the fixed magnetic metal layer(s). The resistive state of MTJs 202 changes based on the relative orientation of the magnetization of the fixed and free layers.

A conformal encapsulation layer 204 is deposited over the MTJs 202 (and portions of the dielectric 102/metal lines 106 in between MTJs 202). See FIG. 2. Suitable materials for encapsulation layer 204 include, but are not limited to, electrical insulators such as silicon nitride (SiN). Encapsulation layer 204 can be deposited using a process such as ALD, CVD or PVD. According to an exemplary embodiment, encapsulation layer 204 has a thickness of from about 5 nm to about 15 nm, and ranges therebetween. The material selected for encapsulation layer 204 should provide etch selectivity to the interlayer dielectric (ILD) 206 fill that is next deposited over the MTJs 202. That way, the topography of the encapsulated MTJs can be used to self-align contacts with the tops of the MTJs (see below).

Figure 3:
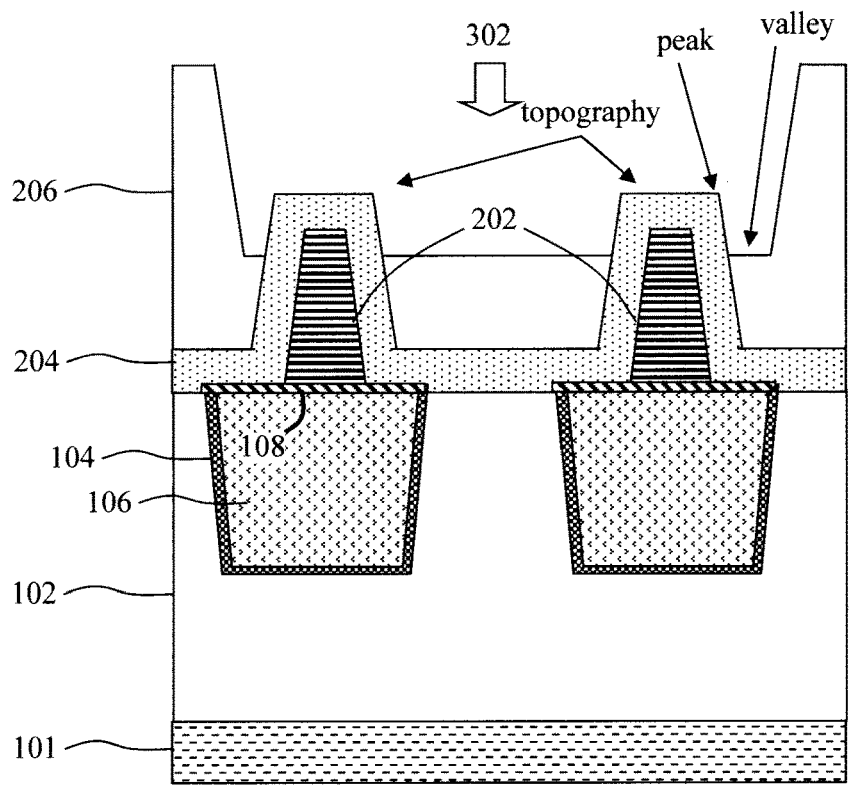
FIG. 3 is a cross-sectional diagram illustrating a trench having been patterned in the second dielectric over the MTJs, exposing the (encapsulated) MTJs within the trench which creates a topography at the bottom of the trench according to an embodiment of the present invention.
Figure 4:
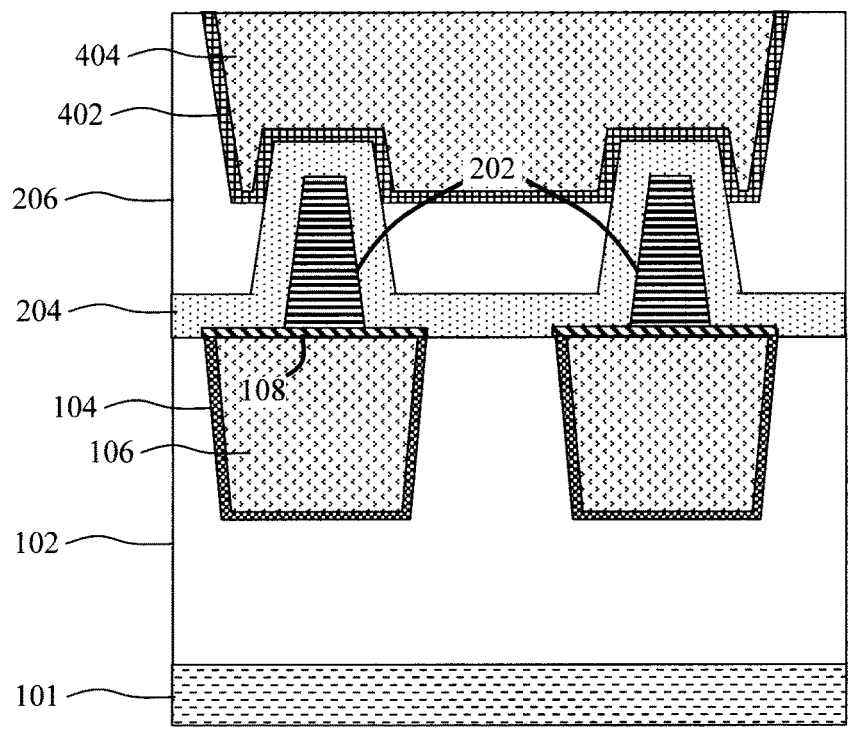
FIG. 4 is a cross-sectional diagram illustrating a conformal barrier layer having been deposited into and lining the trench, and the trench having been filled with a metal(s) to form a metal line over the barrier layer in the trench over the MTJs according to an embodiment of the present invention.

Namely, MTJs 202 are next buried in an ILD 206. The terms "first dielectric" and "second dielectric" may be used herein when referring to dielectric 102 and ILD 206. Suitable ILDs 206 include, but are not limited to, oxide materials such as SiOx and/or SiCOH and/or ULK-ILD materials such as pSiCOH each of which can be etched selective to encapsulation layer 204 (e.g., SiN). ILD 206 can be deposited over/surrounding MTJs 202 using a process such as ALD, CVD, PVD, a casting process such as spin coating, etc. A trench 302 is then patterned in ILD 206 over the MTJs 202, exposing the (encapsulated) MTJs 202 within the trench 302 which creates a topography at the bottom of the trench 302. See FIG. 3. Specifically, as shown in FIG. 3, trench 302 as patterned extends partway through ILD 206 with the bottom of trench 302 being below the encapsulation layer 204 over the MTJs 202. Standard lithography and etching techniques can be employed to pattern trench 302 using, e.g., a directional (i.e., anisotropic) etching process such as reactive ion etching (RIE) for the trench etch. By way of example only, when ILD 206 is an oxide material (see above) an oxide-selective RIE can be used to pattern trench 302 in ILD 206 selective to (e.g., nitride) encapsulation layer 204. The topography at the bottom of trench 302 includes 'peaks' formed by the encapsulation layer 204 over the MTJs 202 and 'valleys' formed by the bottom of the trench 302.

Trench 302 is then filled with a metal or metals to form a metal line 404 over MTJs 202. See FIG. 4. If the interconnects 106 include metal lines, the terms "first" and "second" may be used herein when referring to interconnects 106/metal lines and metal lines 404, respectively. Suitable metals include, but are not limited to, Cu and/or Co. Prior to the metal fill, a conformal barrier layer 402 is deposited into and lining trench 302. Metal line 404 is formed on barrier layer 402, such that barrier layer 402 separates metal line 404 from ILD 206. As provided above suitable barrier materials include, but are not limited to, Ti, TiN, Ta and/or TaN. According to an exemplary embodiment, metal line 404 is Cu, and a thin (e.g., from about 1 nm to about 3 nm) Cu seed layer (not shown) is first deposited onto barrier layer 402 using, e.g., evaporation, sputtering etc. The Cu is then plated onto the seed layer to form metal line 404.

Figure 5:
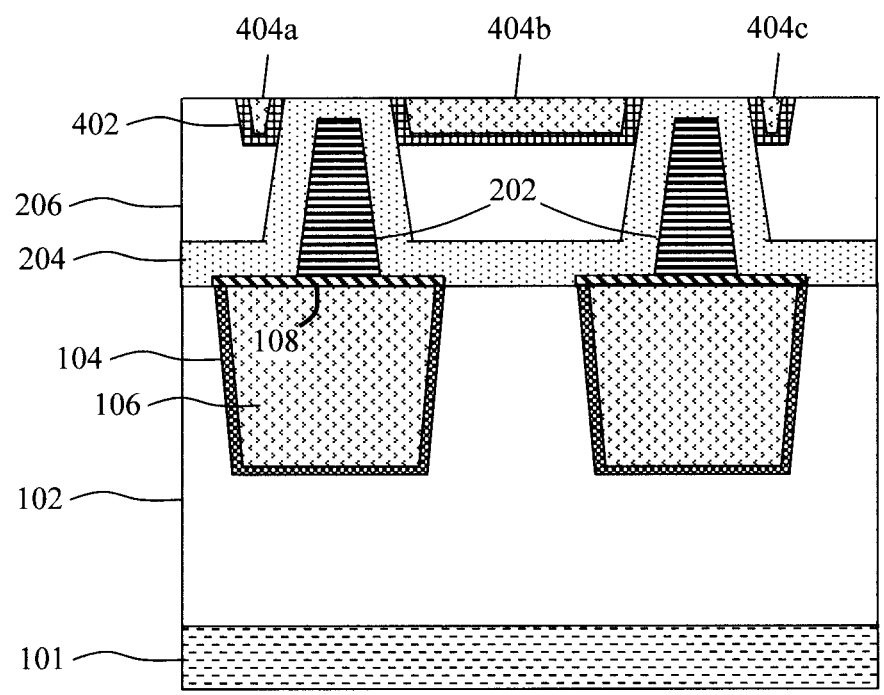
FIG. 5 is a cross-sectional diagram illustrating the metal line having been recessed down to the encapsulation layer which breaks up the metal line into segments separated by exposed peaks of the encapsulation layer at the tops of the MTJs according to an embodiment of the present invention.

Notably, metal line 404 is now formed over the topography created by the (encapsulated) MTJs 202 at the bottom of trench 302. Advantageously, this topography enables encapsulation layer 204 at the tops of the MTJs 202 to be selectively exposed along metal line 404. Namely, as shown in FIG. 5, a polishing process such as CMP is used to recess metal line 404/ILD 206 down to encapsulation layer 204. As a result of this polishing, metal line 404 is now broken up into segments 404a, 404b, 404c, etc. separated by the (now exposed) peaks of encapsulation layer 204 at the tops of the MTJs 202.

Figure 6:
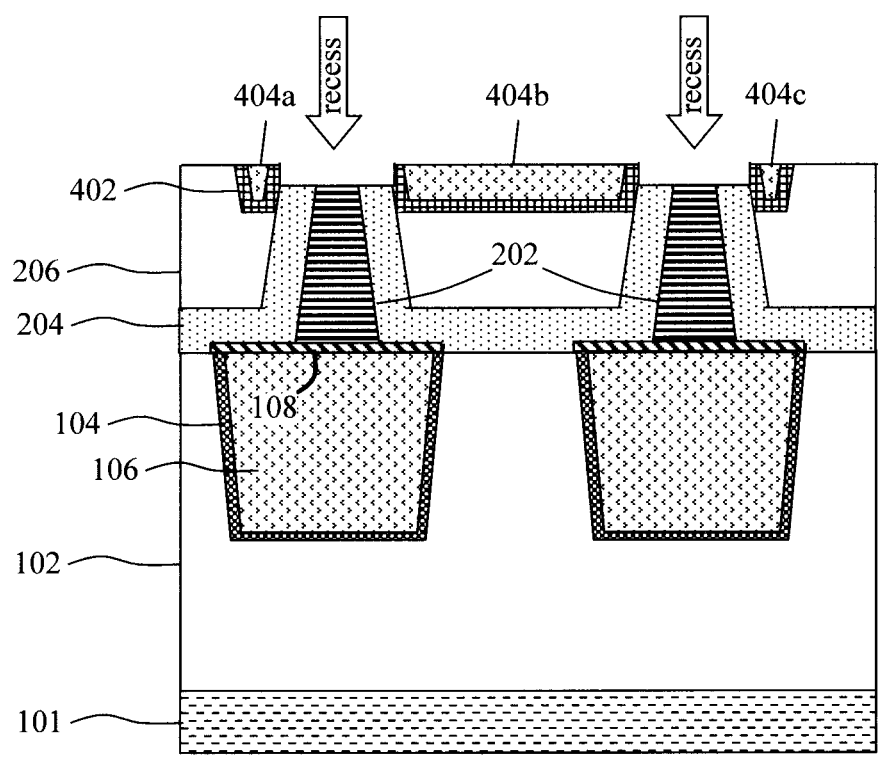
FIG. 6 is a cross-sectional diagram illustrating the exposed peaks of encapsulation layer having been etched to forming recesses at the tops of the MTJs according to an embodiment of the present invention.

A selective etch is then performed to recess the exposed peaks of encapsulation layer 204 forming recesses at the tops of the MTJs 202. See FIG. 6. As shown in FIG. 6, this recessing of encapsulation layer 204 exposes the tops of the MTJs 202 in between metal line segments 404a, 404b, 404c, etc. See FIG. 6. By way of example only, a nitride-selective RIE or wet etch chemistry can be used to selectively etch (e.g., SiN) encapsulation layer 204. By way of this selective recess etching process, the contacts formed over the recessed encapsulation layer 204 (see below) are self-aligned to the tops of the MTJs 202.

Figure 7:
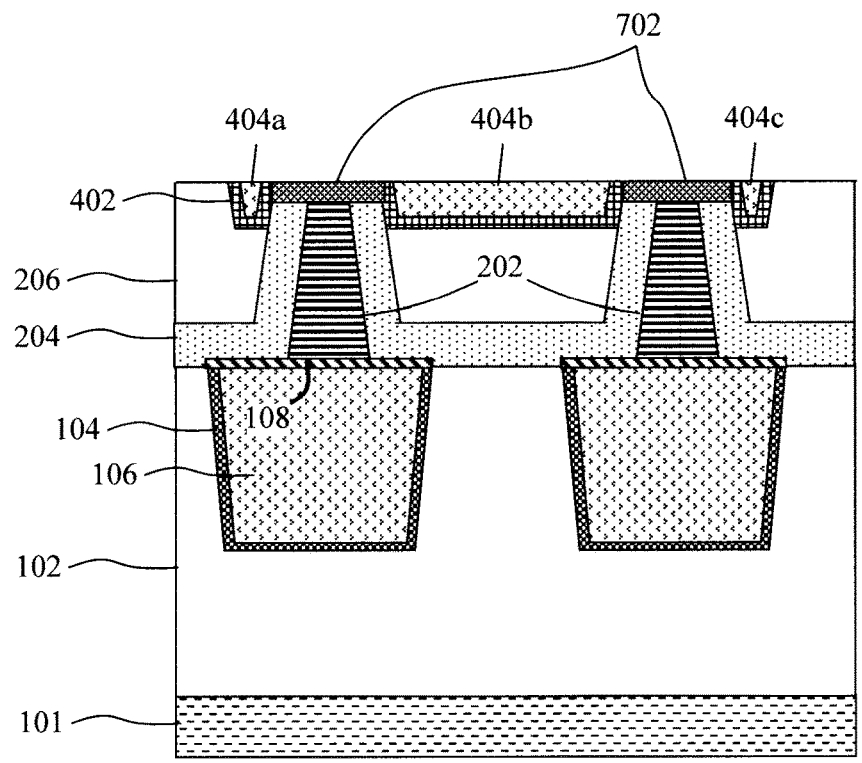
FIG. 7 is a cross-sectional diagram illustrating contacts having been formed in the recesses on top each of the MTJs according to an embodiment of the present invention.

An electrically conductive material is then deposited onto the tops of the MTJs 202 into/filling the recesses, followed by a polishing process such as CMP, to form contacts 702 in the recesses on top of each of the MTJs 202. See FIG. 7. Suitable electrically conductive materials include, but are not limited to, metals such as Ru, Ta, TaN, Ti, TiN, W, Cu and/or Co. As shown in FIG. 7, in the present device structure there is no direct contact between the MTJs 202 and the metal line segments 404a, 404b, 404c, etc. Rather, an electrical connection between MTJs 202 and metal line segments 404a, 404b, 404c, etc. is made via contacts 702. Namely, contacts 702 are in direct physical/electrical contact with MTJs 202. Contacts 702 are electrically connected to metal line segments 404a, 404b, 404c, etc. through barrier layer 402. Thus, MTJs 202 can be accessed through contacts 702 and/or metal line segments 404a, 404b, 404c, etc.

As highlighted above, the present techniques advantageously eliminate the dependency on pull back and overlay of the line above. To illustrate this point, an exemplary methodology forming an MRAM device is now described by way of reference to FIGS. 8-12 where there is some misalignment of the trench patterned over the MTJs 202, as might occur due for example to line pull back. For instance, briefly referring back to FIG. 3 (described above), trench 302 is substantially centered over the MTJs 202. In practice, however, one might expect some level of misalignment of the trench over the MTJs especially near the end of a line.

Figure 2:
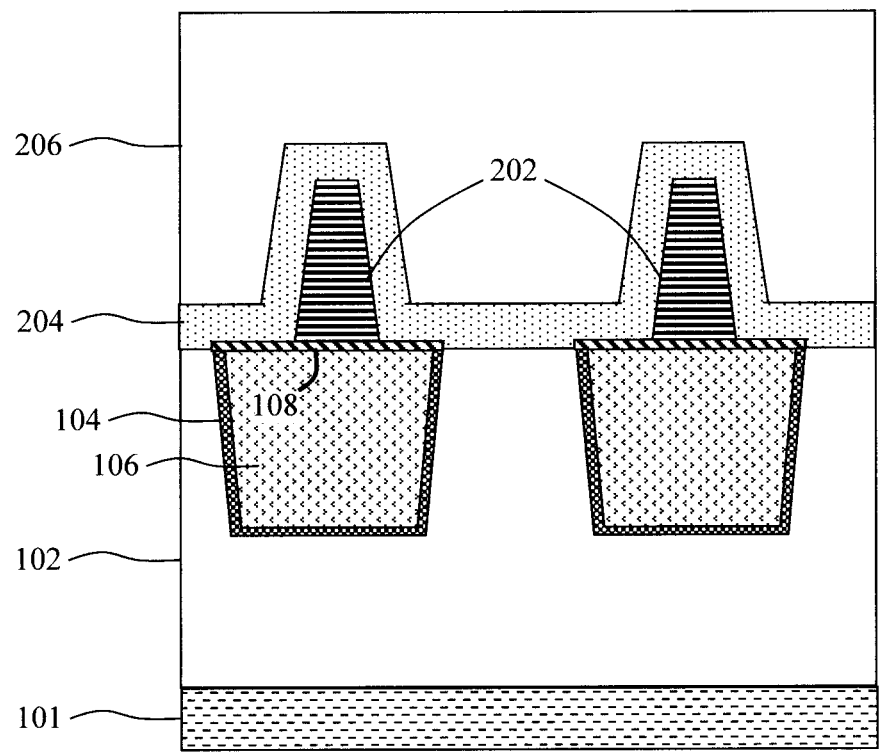
FIG. 2 is a cross-sectional diagram illustrating magnetic tunnel junctions (MTJs) having been formed on the interconnects over the capping layer, a conformal encapsulation layer having been deposited over the MTJs, and a second dielectric (e.g., an interlayer dielectric (ILD)) having been deposited ILD over/surrounding the MTJs according to an embodiment of the present invention.
Figure 8:
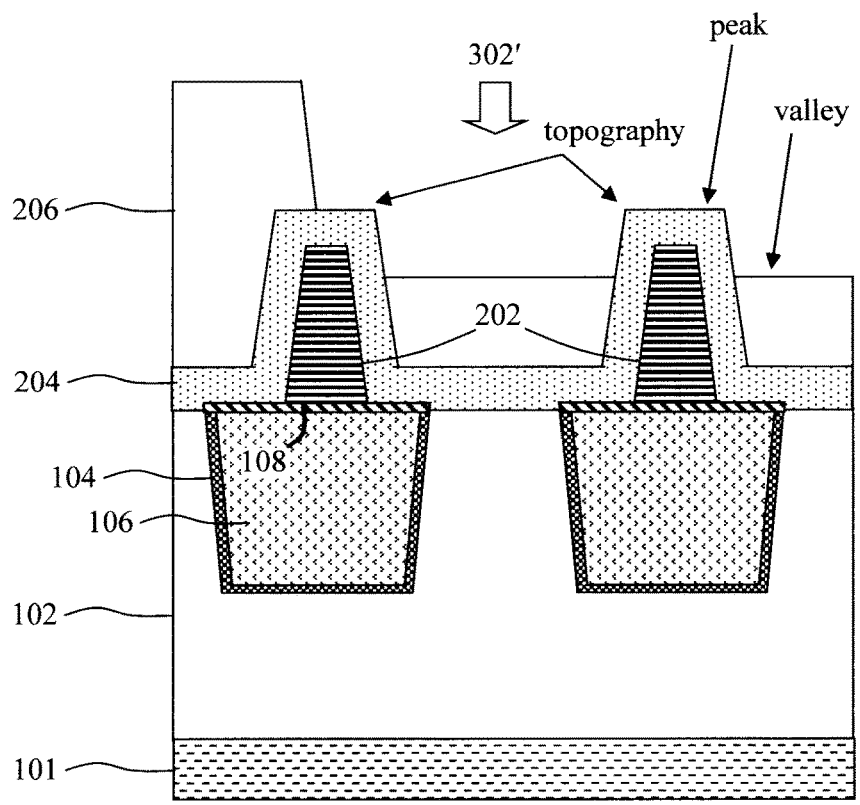
FIG. 8 is a cross-sectional diagram following from FIG. 2 illustrating, according to an alternative embodiment, an offset trench having been patterned in the second dielectric over the MTJs, exposing the (encapsulated) MTJs within the trench which creates a topography at the bottom of the trench according to an embodiment of the present invention.
Figure 9:
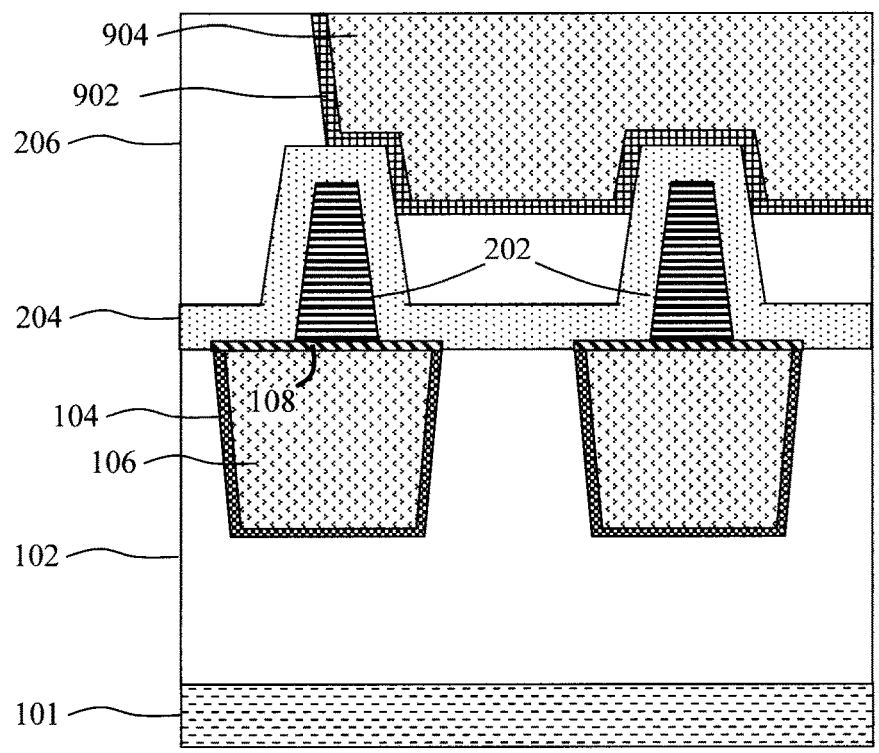
FIG. 9 is a cross-sectional diagram illustrating a conformal barrier layer having been deposited into and lining the trench, and the trench having been filled with a metal(s) to form a metal line over the barrier layer in the trench over the MTJs according to an embodiment of the present invention.
Figure 10:
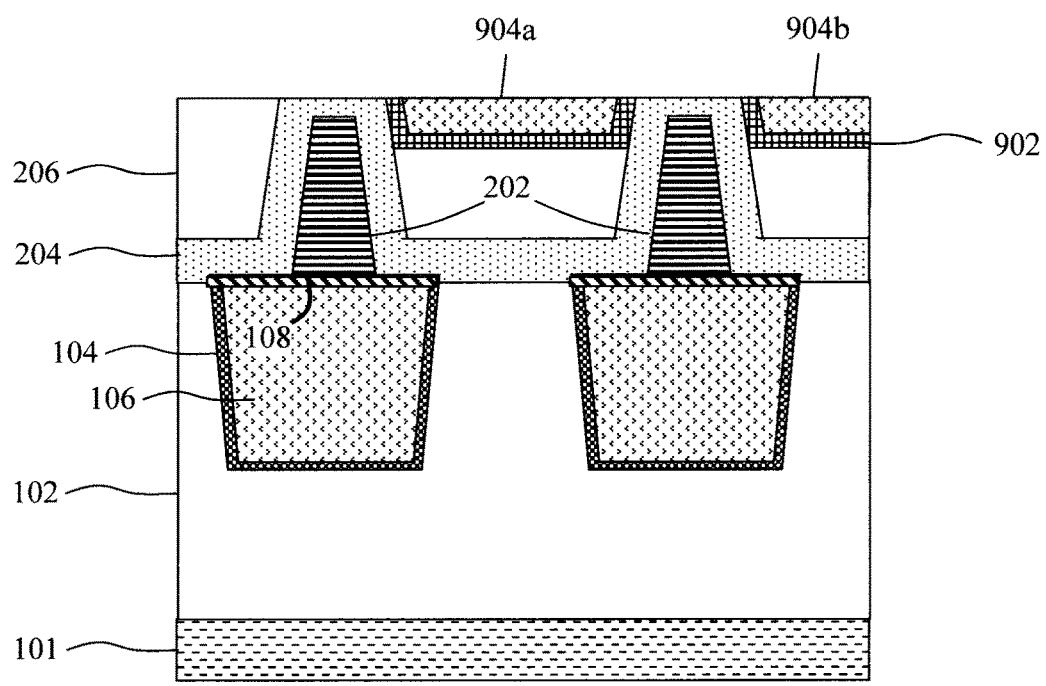
FIG. 10 is a cross-sectional diagram illustrating the metal line having been recessed down to the encapsulation layer which breaks up the metal line into segments separated by exposed peaks of the encapsulation layer at the tops of the MTJs according to an embodiment of the present invention.
Figure 11:
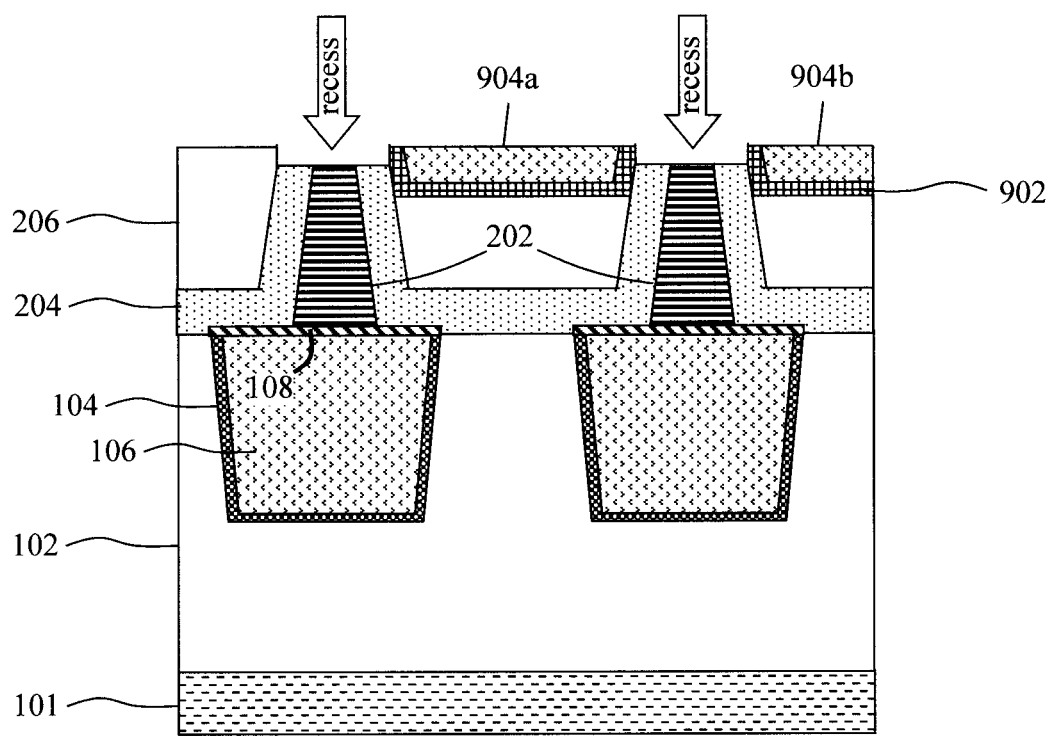
FIG. 11 is a cross-sectional diagram illustrating the exposed peaks of encapsulation layer having been etched to forming recesses at the tops of the MTJs according to an embodiment of the present invention.

The process begins in the same general manner as the example above with the formation of interconnects 106 (e.g., vias and/or metal lines) in dielectric 102 over barrier layer 104 and formation of capping layer 108 on interconnects 106 (see description of FIG. 1, above), formation of MTJs 202 on the interconnects 106, deposition of conformal encapsulation layer 204 and ILD 206 over the MTJs 202 (see description of FIG. 2, above). Thus, FIG. 8 depicts the process that follows from the structure of FIG. 2. Further, like structures are numbered alike in the figures.

As above, a trench 302' is next patterned (e.g., using RIE) in ILD 206 over MTJs 202. See FIG. 8. In this case, however, trench 302' is not directly centered over the MTJs 202 but is instead slightly offset (i.e., off-center) over the MTJs 202. Such misalignment can occur due to processing variations such as pull back (see above). As a result, the encapsulation layer 204 over the top of one of the MTJs 202 (shown arbitrarily on the right in FIG. 8) is fully exposed within trench 302' while only a portion of the encapsulation layer 204 over the top of the other MTJ 202 (shown arbitrarily on the left in FIG. 8) is exposed. Notwithstanding, what is important is that the fully/partially exposed (encapsulated) MTJs 202 create a topography at the bottom of trench 302'. As shown in FIG. 8, the topography at the bottom of trench 302' includes peaks formed by the encapsulation layer 204 over the MTJs 202 and valleys formed by the bottom of the trench 302'.

Trench 302' is then filled with a metal or metals to form a metal line 904 over MTJs 202. See FIG. 9. If the interconnects 106 include metal lines, the terms "first" and "second" may be used herein when referring to interconnects 106/metal lines and metal lines 904, respectively. As provided above, suitable metals include, but are not limited to, Cu and/or Co. Prior to the metal fill, a conformal barrier layer 902 (e.g., Ti, TiN, Ta and/or TaN) is deposited into and lining trench 302'. Metal line 904 is formed on barrier layer 902, such that barrier layer 902 separates metal line 904 from ILD 206. According to an exemplary embodiment, metal line 904 is Cu, and a thin (e.g., from about 1 nm to about 3 nm) Cu seed layer (not shown) is first deposited onto barrier layer 902 using, e.g., evaporation, sputtering etc. The Cu is then plated onto the seed layer to form metal line 904.

Metal line 904 is now formed over the topography created by the (encapsulated) MTJs 202 at the bottom of trench 302'. Advantageously, this topography enables encapsulation layer 204 at the tops of the MTJs 202 to be selectively exposed along metal line 904. Namely, in the same manner as above, a polishing process such as CMP is used to recess metal line 904/ILD 206 down to encapsulation layer 204. See FIG. 10. As a result of this polishing, metal line 904 is now broken up into segments 904a, 904b, etc. separated by the (now exposed) peaks of encapsulation layer 204 at the tops of the MTJs 202.

A selective etch is then performed to recess the exposed peaks of encapsulation layer 204 forming recesses at the tops of the MTJs 202, which exposes the tops of the MTJs 202 in between metal line segments 904a, 904b, etc. See FIG. 11. By way of example only, a nitride-selective RIE or wet etch chemistry can be used to selectively etch (e.g., SiN) encapsulation layer 204. By way of this selective recess etching process, the contacts formed over the recessed encapsulation layer 204 (see below) are self-aligned to the tops of the MTJs 202.

Figure 12:
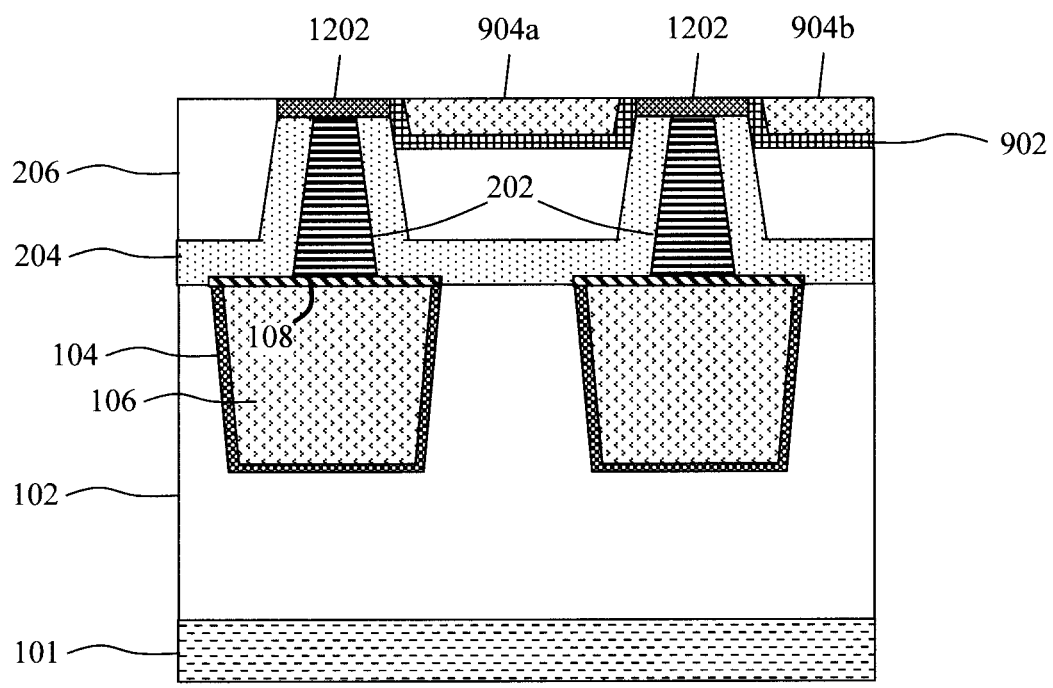
FIG. 12 is a cross-sectional diagram illustrating contacts having been formed in the recesses on top each of the MTJs according to an embodiment of the present invention.

An electrically conductive material is then deposited onto the tops of the MTJs 202 into/filling the recesses, followed by a polishing process such as CMP, to form contacts 1202 in the recesses on top of each of the MTJs 202. See FIG. 12. As provided above, suitable electrically conductive materials include, but are not limited to, metals such as Ru, Ta, TaN, Ti, TiN, W, Cu and/or Co. As shown in FIG. 12, in the present device structure there is no direct contact between the MTJs 202 and the metal line segments 904a, 904b, etc. Rather, an electrical connection between MTJs 202 and metal line segments 904a, 904b, etc. is made via contacts 1202. Namely, contacts 1202 are in direct physical/electrical contact with MTJs 202. Contacts 1202 are electrically connected to metal line segments 904a, 904b, etc. through barrier layer 902. Thus, MTJs 202 can be accessed through contacts 1202 and/or metal line segments 904a, 904b, etc.

Figure 13:
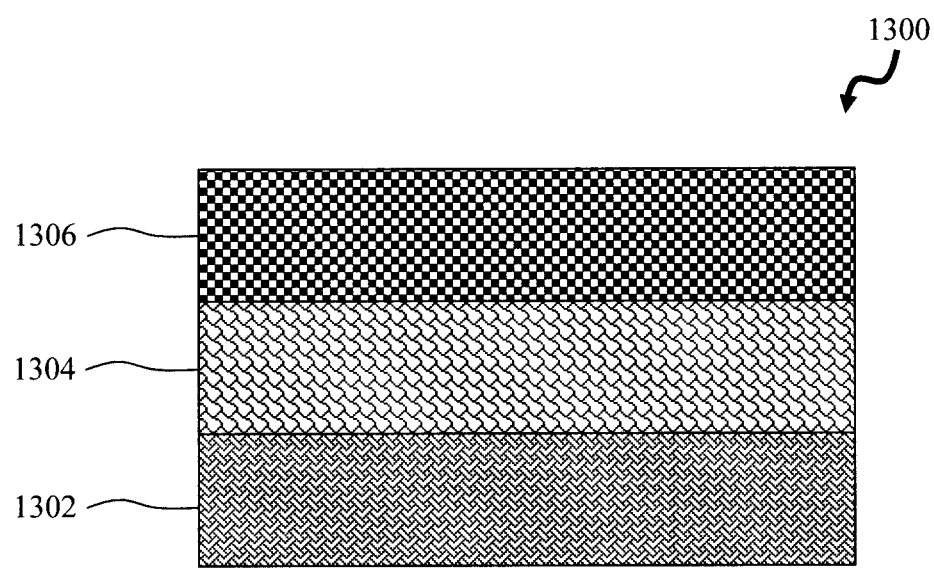
FIG. 13 is a cross-sectional diagram illustrating an exemplary MTJ according to an embodiment of the present invention.

FIG. 13 is a diagram illustrating an exemplary MTJ 1300. MTJ 1300 is representative of the MTJs 202 implemented in the embodiments above. As shown in FIG. 13, MTJ 1300 includes a magnetic metal layer 1302 separated from a magnetic metal layer 1306 by a tunnel barrier 1304. As provided above, suitable materials for the magnetic metal layers 1302 and 1306 include, but are not limited to, Co, Fe, Ni, Co alloys, Fe alloys and/or Ni alloys.

The tunnel barrier 1304 isolates magnetic metal layer 1302 from magnetic metal layer 1306. However, since the tunnel barrier 1304 is ultra-thin, electrons can tunnel through the tunnel barrier 1304 from one magnetic metal layer to the other. For instance, according to an exemplary embodiment, the tunnel barrier has a thickness of from about 2 nm to about 3 nm and ranges therebetween. As provided above, suitable materials for the tunnel barrier 1304 include, but are not limited to, aluminum and/or magnesium oxides.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a magnetic random access memory (MRAM) device, the method comprising the steps of:
   forming magnetic tunnel junctions (MTJs) on interconnects embedded in a first dielectric;
   depositing an encapsulation layer over the MTJs;
   burying the MTJs in a second dielectric;
   patterning a trench in the second dielectric over the MTJs exposing the encapsulation layer over tops of the MTJs which creates a topography at a bottom of the trench;
   forming a metal line in the trench over the topography at the bottom of the trench;
   recessing the metal line down to and exposing the encapsulation layer, wherein the recessing breaks up the metal line into segments separated by exposed peaks of the encapsulation layer over the MTJs;
   recessing the exposed peaks of the encapsulation layer to form recesses at the tops of the MTJs in between the segments of the metal line; and
   forming contacts in the recesses self-aligned to the tops of the MTJs.

2. The method of claim 1, wherein a capping layer is disposed on the interconnects, and wherein the MTJs are formed on the interconnects over the capping layer.

3. The method of claim 2, wherein the capping layer comprises a material selected from the group consisting of: ruthenium (Ru), tantalum (Ta), tantalum nitride (TaN), titanium (Ti), titanium nitride (TiN), tungsten (W) and combinations thereof.

4. The method of claim 1, wherein each of the MTJs comprises:
   at least one free magnetic metal layer;
   at least one fixed magnetic metal layer; and
   a tunnel barrier in between the at least one free magnetic metal layer and the at least one fixed magnetic metal layer.

5. The method of claim 1, wherein the encapsulation layer comprises an insulator.

6. The method of claim 5, wherein the insulator is silicon nitride (SiN).

7. The method of claim 1, wherein the trench, as patterned, is centered over the MTJs.

8. The method of claim 1, wherein the trench, as patterned, is offset over the MTJs such that only a portion of the encapsulation layer over a top of at least one of the MTJs is exposed by the trench.

9. The method of claim 1, further comprising the steps of:
   depositing a barrier layer into and lining the trench; and
   forming the metal line in the trench on the barrier layer.

10. The method of claim 9, wherein the barrier layer comprises a material selected from the group consisting of: titanium (Ti), titanium nitride (TiN), tantalum (Ta), tantalum nitride (TaN), and combinations thereof.

11. The method of claim 1, wherein the contacts are in direct contact with the MTJs, and wherein the contacts are connected to the segments of the metal line.

12. The method of claim 1, wherein the contacts comprise a material selected from the group consisting of: Ru, Ta, TaN, Ti, TiN, W, copper (Cu), cobalt (Co), and combinations thereof.

13. A method for forming a MRAM device, the method comprising the steps of:
   forming MTJs on interconnects embedded in a first dielectric;
   depositing an encapsulation layer over the MTJs;
   burying the MTJs in a second dielectric;
   patterning a trench in the second dielectric over the MTJs exposing the encapsulation layer over tops of the MTJs which creates a topography at a bottom of the trench;
   depositing a barrier layer into and lining the trench;
   forming a metal line in the trench on the barrier layer over the topography at the bottom of the trench;
   recessing the metal line down to and exposing the encapsulation layer, wherein the recessing breaks up the metal line into segments separated by exposed peaks of the encapsulation layer over the MTJs;
   recessing the exposed peaks of the encapsulation layer to form recesses at the tops of the MTJs in between the segments of the metal line; and
   forming contacts in the recesses self-aligned to the tops of the MTJs, wherein the contacts are in direct contact with the MTJs, and wherein the contacts are connected to the segments of the metal line through the barrier layer.

14. The method of claim 13, wherein the encapsulation layer comprises an insulator.

15. The method of claim 14, wherein the insulator is SiN.

16. The method of claim 13, wherein the trench, as patterned, is centered over the MTJs.

17. The method of claim 13, wherein the trench, as patterned, is offset over the MTJs such that only a portion of the encapsulation layer over a top of at least one of the MTJs is exposed by the trench.

18. The method of claim 13, wherein the barrier layer comprises a material selected from the group consisting of: Ti, TiN, Ta, TaN, and combinations thereof.

19. The method of claim 13, wherein the contacts comprise a material selected from the group consisting of: Ru, Ta, TaN, Ti, TiN, W, Cu, Co, and combinations thereof.

20. A method for forming a MRAM device, the method comprising the steps of:
forming MTJs on interconnects embedded in a first dielectric;
depositing an encapsulation layer over the MTJs;
burying the MTJs in a second dielectric;
patterning a trench in the second dielectric over the MTJs exposing the encapsulation layer over tops of the MTJs which creates a topography at a bottom of the trench, wherein the trench as patterned is offset over the MTJs such that only a portion of the encapsulation layer over a top of at least one of the MTJs is exposed by the trench;
depositing a barrier layer into and lining the trench;
forming a metal line in the trench on the barrier layer over the topography at the bottom of the trench;
recessing the metal line down to and exposing the encapsulation layer, wherein the recessing breaks up the metal line into segments separated by exposed peaks of the encapsulation layer over the MTJs;
recessing the exposed peaks of the encapsulation layer to form recesses at the tops of the MTJs in between the segments of the metal line; and
forming contacts in the recesses self-aligned to the tops of the MTJs, wherein the contacts are in direct contact with the MTJs, and wherein the contacts are connected to the segments of the metal line through the barrier layer.

21. An MRAM device, comprising:
MTJs disposed on interconnects embedded in a first dielectric;
an encapsulation layer disposed over the MTJs;
a second dielectric surrounding the MTJs;
recesses in the encapsulation layer at the tops of the MTJs in between segments of a metal line, wherein the segments of the metal line are separated from the second dielectric by a barrier layer; and
contacts formed in the recesses that are self-aligned to the tops of the MTJs, wherein the contacts are in direct contact with the MTJs, and wherein the contacts are connected to the segments of the metal line through the barrier layer.

22. The MRAM device of claim 21, further comprising:
a capping layer disposed on the interconnects, wherein the MTJs are disposed on the interconnects over the capping layer, and wherein the capping layer comprises a material selected from the group consisting of: Ru, Ta, TaN, Ti, TiN, W and combinations thereof.

23. The MRAM device of claim 21, wherein each of the MTJs comprises:
at least one free magnetic metal layer;
at least one fixed magnetic metal layer; and
a tunnel barrier in between the at least one free magnetic metal layer and the at least one fixed magnetic metal layer.

24. The MRAM device of claim 21, wherein the barrier layer comprises a material selected from the group consisting of: Ti, TiN, Ta, TaN, and combinations thereof.

25. The MRAM device of claim 21, wherein the contacts comprise a material selected from the group consisting of: Ru, Ta, TaN, Ti, TiN, W, Cu, Co, and combinations thereof.

* * * * *